United States Patent [19]

Slatter

[11] Patent Number: 5,083,176
[45] Date of Patent: Jan. 21, 1992

[54] SEMICONDUCTOR DEVICE HAVING INCREASED BREAKDOWN VOLTAGE

[75] Inventor: John A. G. Slatter, Crawley Down, England

[73] Assignee: U.S. Philips Corp., New York, N.Y.

[21] Appl. No.: 638,230

[22] Filed: Jan. 7, 1991

[30] Foreign Application Priority Data

Jan. 10, 1990 [GB] United Kingdom ............. 9000531

[51] Int. Cl.$^5$ ............................................. H01L 27/14
[52] U.S. Cl. ................................. 357/30; 357/34; 357/35; 357/38; 357/51
[58] Field of Search ............... 357/30 P, 30 G, 30 R, 357/34, 35, 38 LA, 51

[56] References Cited

U.S. PATENT DOCUMENTS 4,737,832 4/1988 Kyuma ........................... 357/30 P

FOREIGN PATENT DOCUMENTS 62-73680 4/1987 Japan ............................ 357/30 P X

*Primary Examiner*—William Mintel
*Attorney, Agent, or Firm*—Steven R. Biren

[57] ABSTRACT

A semiconductor body (1) has a portion (2a) of one conductivity type adjacent one major surface (3). A first active device region (4) forms with the portion (2a) a first pn junction (5) which terminates at the one major surface (3) and is reverse-biassed in at least one mode of operation of the device. A second active device region (6) provided within the first active device region (4) forms with the first active device region (4) a second pn junction (7) terminating at the one major surface (3). One or more further regions (8) of the opposite conductivity type are provided with the portion (2a) adjacent the one major surface (3) surrounding and spaced from the first pn junction (5) to lie within the spread of the depletion region when the first pn junction (5) is reverse-biased in the at least one mode of operation. An additional region (9) of the opposite conductivity type is provided between and spaced from the first pn junction (5) and an inner one (8a) of the further regions (8), and an electrical connection (10) is provided between the additional region (9) and the second active device region (6) to provide a path for the flow of charge carriers between the further regions (8) and the second device region (6).

5 Claims, 1 Drawing Sheet

SEMICONDUCTOR DEVICE HAVING INCREASED BREAKDOWN VOLTAGE

BACKGROUND OF THE INVENTION

This invention relates to a semiconductor device, such as a bipolar transistor, having at least one junction which is operated under reverse-bias in at least one mode of operation of the device.

EP-A-124139, corresponding to U.S. Pat. Nos. 4,602,266 and 4,774,560, describes a semiconductor device comprising a semiconductor body having a portion of one conductivity type adjacent one major surface, a first active device region forming with the said portion a first pn junction which terminates at the one major surface and is reverse-biassed in at least one mode of operation of the device, a second active device region provided within the first active device region and forming with the first active device region a second pn junction terminating at the one major surface, and one or more further regions of the opposite conductivity type within the said portion adjacent the one major surface and located surrounding and spaced from the first pn junction to lie within the spread of the depletion region of the first pn junction in the one mode of operation of the device to increase the reverse breakdown voltage of the first pn junction.

As described in EP-A-124139, the semiconductor device may be a vertical device and may comprise, for example, a vertical bipolar transistor with the said portion forming at least part of the collector region and the first and second active device regions forming the base and emitter regions, respectively, of the transistor. In operation of the device, the further regions act to spread the depletion region of the first pn junction laterally so as to reduce the surface electric field during the at least one mode of operation of the device, thereby increasing the breakdown voltage of the first pn junction. The further regions do, however, add to the capacitance between the said portion and the first active device region, that is the base-collector capacitance.

SUMMARY OF THE INVENTION

It is an aim of the present invention to provide a semiconductor device in which further regions are provided to increase the breakdown voltage of the first pn junction and which, in the case of a bipolar transistor, may have increased switching speed and high frequency gain.

According to the present invention, there is provided a semiconductor device comprising a semiconductor body having a portion of one conductivity type adjacent one major surface, a first active device region forming with the said portion a first pn junction which terminates at the one major surface and is reverse-biassed in at least one mode of operation of the device, a second active device region provided within the first active device region and forming with the first active device region a second pn junction terminating at the one major surface, and one or more further regions of the opposite conductivity type within the said portion adjacent the one major surface and located surrounding and spaced from the first pn junction to lie within the spread of the depletion region of the first pn junction in the one mode of operation to increase the reverse breakdown voltage of the first pn junction, characterized in that an additional region of the opposite conductivity type is provided within the said portion between and spaced from the first pn junction and the further region or an inner one of the further regions, and an electrical connection is provided between the additional region and the second active device region.

Thus, in a semiconductor device in accordance with the invention, an additional region of the opposite conductivity type provided between the first pn junction and the (or the inner) further region is connected to the second active device region to enable, in the at least one mode of operation of the device where the first pn junction is reverse-biassed, charge carriers of the opposite conductivity type leaving the further regions and transported towards the first pn junction to be collected by the additional region so that the capacitive current resulting from the presence of the further regions is carried by the connection to the second active device region. Thus, in the case of a bipolar transistor, this capacitive current is provided by the output circuit, that is the collector-emitter circuit, rather than the input circuit, that is the base-emitter circuit, enabling an increase in the high frequency gain and/or switching speed of the bipolar transistor.

The connection between the additional region and the second active device region may be formed by the metallization provided to make electrical contact to the second active device region, this metallization being isolated from the first active device region, so that it is merely necessary to alter the mask pattern used to diffuse the contact metallization for the second active device region and no additional deposition steps are necessary. The electrical connection may form part of a resistive divider which connects the additional region via a first resistance to the second device region and via a second resistance to the first device region. This may be of particular advantage where the device is a photosensitive bipolar transistor as the resistive divider enables a desired balance to be achieved between light sensitivity and switching speed (or high frequency operation).

BRIEF DESCRIPTION OF THE DRAWINGS

Embodiments of the invention will now be described, by way of example, with reference to the accompanying drawing, in which.

Figure 1:
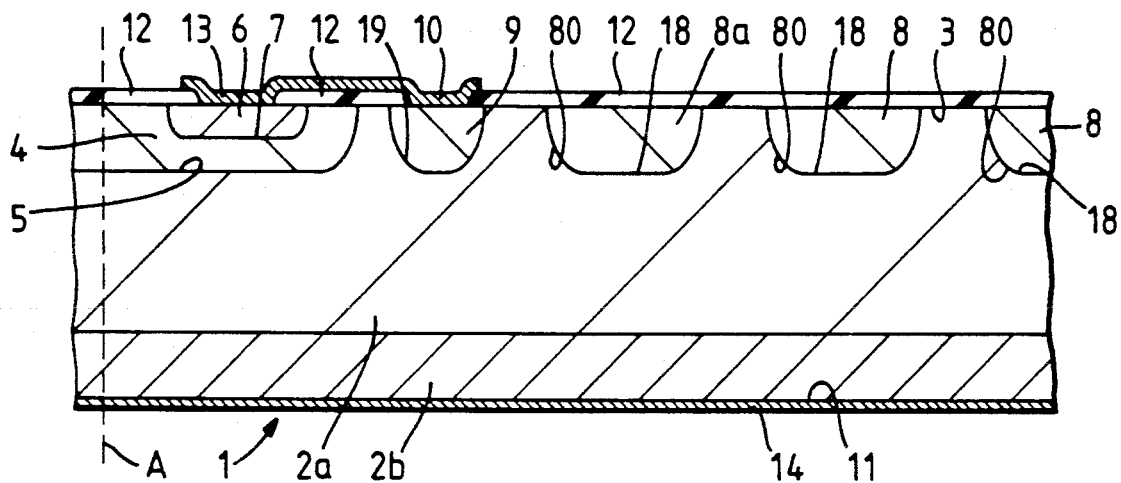
FIG. 1 is a cross-sectional view of part of a first embodiment of a semiconductor device in accordance with the invention.

It should be understood that the Figures are merely schematic and are not drawn to scale. In particular certain dimensions such as the thickness of layers or regions may have been relatively exaggerated while other dimensions may have been reduced. It should also be understood that the same reference numerals are used throughout the Figures to indicate the same or similar parts.

DESCRIPTION OF THE PREFERRED EMBODIMENTS

Referring now to the drawings, for example FIG. 1, there is illustrated a semiconductor device comprising a semiconductor body 1 having a portion 2a of one conductivity type adjacent one major surface 3, a first active device region 4 forming with the said portion 2a a first pn junction 5 which terminates at the one major surface 3 and is reverse-biassed in at least one mode of operation of the device, a second active device region 6 provided within the first active device region 4 and forming with the first active device region 4 a second pn junction 7 terminating at the one major surface 3, and one or more further regions 8 of the opposite conductivity type within the said portion adjacent the one major surface 3 and located surrounding and spaced from the first pn junction 5 to lie within the spread of the depletion region of the first pn junction 5 when the first pn junction 5 is reverse-biassed in the at least one mode of operation of the device.

In accordance with the invention, an additional region 9 of the opposite conductivity type is provided within the said portion 2a between and spaced from the first pn junction 5 and the further region 8 or an inner one 8a of the further regions 8, and an electrical connection 10 is provided between the additional region 9 and the second active device region 6 to provide a path for the flow of charge carriers between the further regions 8 and the emitter region 6 so that any capacitive current resulting from the presence of the further regions 8 can be provided by the output collector-emitter circuit rather than by the input base-emitter circuit enabling an increase in the high frequency capability and/or switching speed of the bipolar transistor.

FIG. 1 is a schematic cross-sectional view through part of a photosensitive bipolar transistor similar to that described in EP-A-280368 (corresponding to U.S. patent application Ser. No. 581,450) but incorporating the additional region 9 connected via the metallization 10 to the emitter region 6 in accordance with the present invention. In this example, the semiconductor body 1 comprises a monocrystalline silicon body in which the said portion 2a is formed by a relatively lowly doped layer of the one conductivity type, n conductivity type in this example, which adjoins a more highly doped layer 2b of the one conductivity type adjacent the other major surface 11 of the semiconductor body 1. Together the layers 2a and 2b form the collector region of the bipolar transistor.

The first active device region 4 forms the base region of the bipolar transistor and is doped with p conductivity type impurities while the second active region 6 forms the emitter region of the bipolar transistor and is of n conductivity type.

In the example of FIG. 1 three further regions 8 are shown, although there may be many more or less. The further regions 8 are floating regions, that is there is no electrical connection to the further regions 8, and lie within the spread of the depletion region of the first pn junction 5 so that, when the first pn junction 5 is reverse-biassed in the one mode of operation of the device, the further regions 8 act to spread the depletion region laterally outwardly so reducing the electric field at the one major surface 3 and thereby increasing the breakdown voltage of the first pn junction 5.

Each of the further regions 8 and the additional region 9 forms a photosensitive pn junction 18,19 with the portion 2a. A passivating layer 12 capable of transmitting light within the wavelength range which the photosensitive transistor is designed to detect, for example a layer of silicon dioxide or a layer of highly resisitive oxygen-containing polycrystalline silicon providing a so-called bleed resistor over the floating further regions 8, is provided on the one major surface 3 to cover the further regions 8. Windows formed in the passivating layer 12 enable contact to be made to the emitter region 6 by metallization 13 which, in this example, also contacts the additional region 9, via a further window in the passivating layer 12, to provide the electrical connection between the emitter region 6 and the additional region 9. Metallization 14 is also provided on the other major surface 11 to provide an electrical connection to the collector region 2a, 2b.

The photosensitive bipolar transistor shown in FIG. 1 may be manufactured using conventional semiconductor processing techniques. In particular, the base region 4, additional region 9 and further regions 8 may be formed at the same time by introducing p conductivity type impurities, for example by implanting boron ions, through an appropriate mask.

The additional region 9 should be sufficiently large to enable good ohmic contact by the metallization 10 and so as to avoid excessive curvature of the pn junction 19 which would result in undesirably high electric fields. Otherwise, the additional region 9 can be formed to be as small as practically possible so as to reduce the area taken up by the additional region 9. In addition, because the additional region 9 is electrically connected to the emitter region 6, the adjacent portions of the first pn junction 5 and the pn junction 19 will both be reverse-biassed in operation of the device so that the additional region 9 can be placed quite close to the base region 4, although not so close that the depletion regions associated with the first pn junction 5 and the pn junction 19 meet under zero applied bias.

As shown in FIG. 1, the floating further regions 8 are wider than the additional region 9. The actual number, width, depth and spacing of the floating further regions 8 will be determined in known manner to provide the first pn junction 5 with the desired reverse breakdown voltage and may be tailored as described in, for example, EP-A-115093 (corresponding to U.S. Pat. No. 4,573,066) or EP-A-124139. Typically the floating further regions 8 may be spaced to provide a potential drop of about 5 volts within the depletion layer between adjacent further regions 8.

In operation of the device shown in FIG. 1, the first pn junction 5 is reverse-biassed by a voltage applied across the emitter and collector metallizations 13 and 14. The thus-formed depletion region is spread laterally outwardly by the further regions 8 so that the further regions 8 lie within the depletion region and, by reducing the surface electric field, increase the breakdown voltage of the first pn junction 5.

When light in the wavelength range which the transistor is designed to detect is incident on the passivating layer 10 and is transmitted into the semiconductor body 1, electron-hole pairs are generated within the semiconductor body 1 and, in the vicinity of the photosensitive pn junctions 18,19, the holes of the thus-photogenerated electron-hole pairs are swept by the drift electric field of the laterally spread depletion region towards the first active device or base region 4 while the electrons are swept into the collector region 2a,2b. Where, as shown in FIG. 1, there are a number of floating further regions 8, the holes of electron-hole pairs photogenerated in the vicinity of the outer floating further regions 8 may, as they are swept towards the base region 2, be absorbed and then reinjected into the depletion region by one or more of the further regions 8 lying between the base region 4 and the area in which the holes are photogenerated.

The further regions 8 thus provide an edge termination system for increasing the breakdown voltage of the first pn junction. At the same time the area taken up by the further regions 8 is used as a light collecting area enabling the area of light collection to be increased with increase in the number of further regions 8 and thus with breakdown voltage.

When the light is no longer incident on the photosensitive transistor it is of course desired that the transistor no longer conducts. However, because of the addition to the base-collector capacitance caused by the presence of the further regions 8, the transistor may be rather slow to switch off and may not, particularly where the device is a very high voltage transistor with a large number of floating regions 8, be suitable for high frequency application. The provision of the additional region 9 allows the capacitive current resulting from the presence of the further regions 8 to flow to the emitter region 6 rather than to the base region 4 so that this current is provided by the output, that is the collector-emitter, circuit rather than the input base-emitter circuit, enabling an increase in the high frequency gain and/or switching speed.

Experiments have been carried out where a sinusoidal voltage swinging between 0 and 700 (or 1100) volts has been applied between the base region 4 and the collector region 2a,2b with in one case the additional region 9 connected to the base region 4 and in the other case with the additional region 9 connected to ground. For sinusoidal frequencies of 1 kHz and 10 kHz, the collector-base capacitance was found to be reduced by a factor of about two when the additional region 9 was connected to the base region 4 rather than to ground.

Thus, when the light is no longer incident on the passivating layer 10 but the first pn junction 5 is still reverse-biassed with the depletion region extending throughout the portion 2a, electrons are removed from the portion 2a and holes from the base region 4 and the further regions 8 with the current that consequently flows forming the collector-base capacitive current. The hole current from a further region 8 leaves that further region at the portion 80 where the pn junction 18 is forward-biassed, that is adjacent the next one further region or the additional region 9 in the case of the innermost further region 8. After leaving a further region 8, the holes are transported by the drift electric field in the depletion region towards the first pn junction 5 being, in most cases, absorbed and reinjected by those further regions 8 closer to the first pn junction 5 so that the majority of the hole current passes to the additional region 9 and thence via the electrical connection 10 to the emitter metallization 13. Similarly, when the operating voltage is removed from the emitter metallization 13, the electrical connection 10 allows the resulting hole current to flow in the reverse direction that is via the electrical connection 10 additional region 9 and further regions 8 rather than to the base region 4 so that again the current is provided by the output collector-emitter circuit.

The further regions 8 may be annular regions or rings extending around the first pn junction 5 and having a similar peripheral shape (when viewed in plan) to the base region 4. Thus, for example, the base and further regions 4 and 8 may have a circular periphery. Alternatively, or additionally, the further regions 8 may be provided as spaced-apart islands arranged to surround the first active device region 4. The additional region 9 will generally have a similar geometry, when viewed in plan, to the base and further regions 4 and 8.

Figure 2:
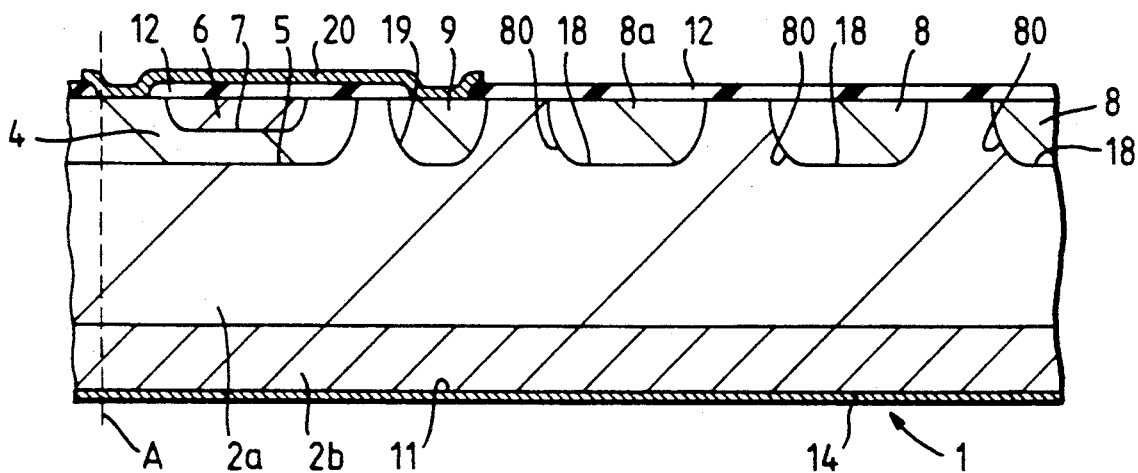
FIG. 2 is a cross-sectional view of the part of the semiconductor device shown in FIG. 1 taken parallel to but offset from that shown in FIG. 1.

The presence of the electrical connection 10 between the emitter region 6 and the additional region 9 may shunt some of the photogenerated hole current to the emitter region 6 and so reduce the sensitivity of the photosensitive transistor to light incident on the passivating layer 10. However, the proportion of the hole current carried by the electrical connection 10 to the emitter region 6 may be adjusted to achieve a desired balance between light sensitivity and switching speed (or high frequency operation). This could be achieved by designing the electrical connection 10 and the device structure so that the conductive path provided by the electrical connection 10 is of comparable resistance to the path for holes within the semiconductor body 1 from the additional region 9 to the base region 4 in operation of the device, that is when light is incident on the passivating layer 12. A simpler method may be to make the electrical connection 10 part of a resistive divider which connects the additional region 9 via a first resistance to the emitter region 6 and via a second resistance to the base region 4 and to select the first and second resistances appropriately. The first and second resistances may be formed by external (that is separate) resistors or may be provided by metallization. FIG. 2 is a cross-sectional view through a photosensitive transistor similar to that shown in FIG. 1 with the cross-section taken parallel to but offset from that of FIG. 1 to illustrate a portion 20 of the metallization pattern provided to form the second resistance between the additional region 9 and the base region 4.

Figure 3:
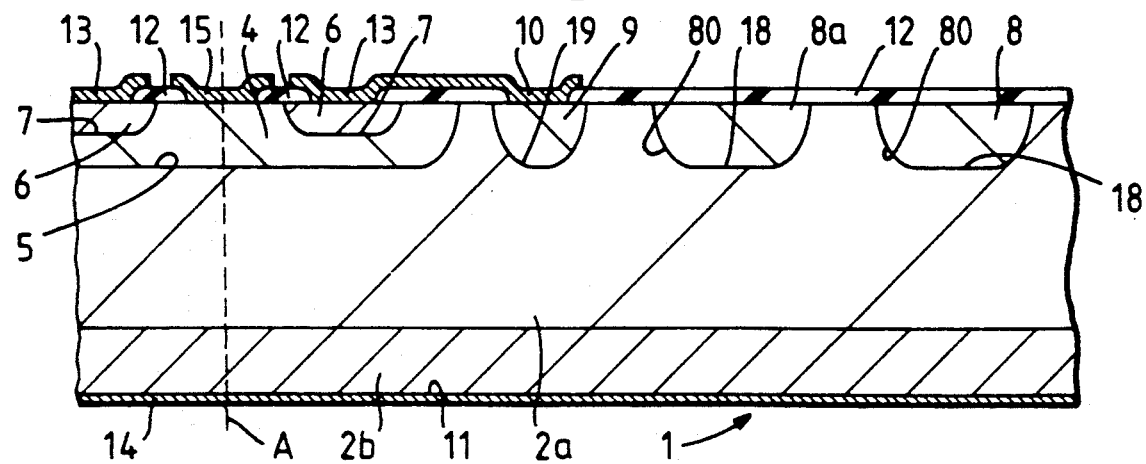
FIG. 3 is a cross-sectional view of part of a second embodiment of a semiconductor device in accordance with the invention.

FIG. 3 is a cross-sectional view similar to FIG. 1 of a conventional, that is non-light-sensitive, bipolar transistor. Again the bipolar transistor may be symmetrical about an axis A. As will be evident from FIG. 3, the main difference between this device and that shown in FIG. 1 is that a window is formed in the passivating layer 12 to enable the metallization deposited to form the emitter metallization 10 also to provide a separate base contact 15. As in the case of the transistor shown in FIG. 1, if desirable, the electrical connection 10 may form part of a resistive divider which also connects the additional region 9 to the base region 4.

The device shown in FIG. 3 operates in a manner similar to that shown in FIG. 1 with the removal of the base drive signal from the base contact being equivalent to the switching off or blocking of the light incident on the passivating layer 12 in FIG. 1.

The emitter regions 6 may have any desired known geometry. For example the emitter regions 6 may be formed of a plurality of separate emitter fingers or may be of a hollow configuration, for example in the form of a frame defining the bounds of two back-to-back comb shapes or an annulus. Where the emitter region 6 is of a hollow configuration, then the device may be symmetrical about an axis A shown in dashed lines in the Figures.

The present invention may be applied to other semiconductor devices, especially other bipolar devices. Although the devices described above are vertical devices, that is where the main current path (i.e. between collector and emitter or source and drain) is between the one and the other major surfaces 3 and 11, the present invention could be applied to lateral devices, that is where the main current path is parallel to the one major surface 3. Also, the conductivity types given above could be reversed and, for example, the first layer 2b may be of the opposite rather than the one conductivity type so as to form, for example, a thyristor. In addition, the present invention may be applied to semiconductor materials other than silicon.

From reading the present disclosure, other modifications or variations will be apparent to persons skilled in the art. Such modifications or variations may involve other features which are already known in the semiconductor art and which may be used instead of or in addition to features already described herein.

I claim:

1. A semiconductor device comprising a semiconductor body having a portion of one conductivity type adjacent one major surface, a first active device region forming with said portion a first pn junction which terminates at the one major surface and is reverse-biased in at least one mode of operation of the device, a second active device region provided within the first active device region and forming with the first active device region a second pn junction terminating at the one major surface, and one or more further regions of an opposite conductivity type within said portion adjacent the one major surface and located surrounding and spaced apart from the first pn junction to lie within a spread of the depletion region of the first pn junction in the one mode of operation to increase the reverse breakdown voltage of the first pn junction, characterized in that an additional region of the opposite conductivity type is provided within said portion between and spaced apart from the first pn junction and one of the further region and an inner one of the further regions, and an electrical connection is provided between the additional region and the second active device region.

2. A semiconductor device according to claim 1, further characterised in that the electrical connection between the additional region and the second active device region is provided by contact metallization contacting the second active device region but isolated from the first active device region.

3. A semiconductor device according to claim 1, further characterised in that the electrical connection forms part of a resistive divider which connects the additional region via a first resistance to the second device region and via a second resistance to the first device region.

4. A semiconductor device according to claim 1, further characterized in that the semiconductor device comprises a vertical device and the said portion forms at least part of a third active device region extending towards an other major surface of the semiconductor body.

5. A semiconductor device according to claim 1, further characterised in that the first and second active device regions form the base and emitter regions, respectively, of a bipolar transistor.

* * * * *